(12) United States Patent  (10) Patent No.: US 8,526,256 B2
Ghosh et al.  (45) Date of Patent: Sep. 3, 2013

(54) SINGLE-ENDED SENSE AMPLIFIER WITH READ-ASSIST

(75) Inventors: Amlan Ghosh, Austin, TX (US); Jente B. Kuang, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 13/234,218

(22) Filed: Sep. 16, 2011

(65) Prior Publication Data

US 2013/0070549 A1 Mar. 21, 2013

(51) Int. Cl.
*G11C 7/00* (2006.01)

(52) U.S. Cl.
USPC .......................................................... 365/203

(58) Field of Classification Search
USPC .......................................................... 365/203
See application file for complete search history.

(56) References Cited

U.S. PATENT DOCUMENTS

| | | | |
|---|---|---|---|
| 5,047,979 | A | 9/1991 | Leung |
| 5,265,047 | A | 11/1993 | Leung et al. |
| 7,508,698 | B2 | 3/2009 | Houston |
| 2001/0028588 | A1* | 10/2001 | Yamada et al. ............. 365/210 |
| 2006/0255850 | A1* | 11/2006 | Luk et al. .................. 327/208 |
| 2010/0246293 | A1* | 9/2010 | Dudeck et al. ............. 365/194 |
| 2012/0182818 | A1* | 7/2012 | Huang et al. ............... 365/203 |
| 2012/0213023 | A1* | 8/2012 | Dawson et al. ............. 365/203 |
| 2012/0230139 | A1* | 9/2012 | Son et al. .................. 365/203 |

FOREIGN PATENT DOCUMENTS

| | | |
|---|---|---|
| EP | 0451594 A3 | 10/1991 |
| EP | 0478252 A2 | 4/1992 |
| EP | 0547890 A3 | 6/1993 |
| EP | 0763828 A2 | 3/1997 |
| JP | 090737914 A | 3/1997 |

OTHER PUBLICATIONS

Chang, Leland et al., "A 5.3GHz 8T-SRAM with Operation Down to 0.41V in 65nm CMOS", 2007 Symposium on VLSI Circuits Digest of Technical Papers, 2007, pp. 252-253.
Qazi, Masood et al., "A 512kb 8T SRAM Macro Operating Down to 0.57V With an AC-Coupled Sense Amplifier and Embedded Data-Retention-Voltage Sensor in 45 nm SOI CMOS", IEEE Journal of Solid-State Circuits, vol. 46, No. 1, Jan. 2011, pp. 85-96.

(Continued)

*Primary Examiner* — Hoai V Ho
*Assistant Examiner* — Min Huang
(74) *Attorney, Agent, or Firm* — Francis Lammes; Stephen J. Walder, Jr.; Eustus D. Nelson

(57) ABSTRACT

A sense amplifier is provided that comprises, responsive to receiving a set signal to turn on a set device and a precharged voltage level read bit line signal, a keeper device that turns on responsive to receiving a LOW signal from an inverting amplifier and pulls up the voltage at a first node so that a HIGH signal is output onto a global bit line. Responsive to receiving the set signal to turn on the set device and a read bit line signal that is discharging through a read stack path to ground and responsive to the read bit line signal discharging below a first predesigned voltage level, a read assist device in the sense amplifier turns on responsive to receiving a HIGH signal from the inverting amplifier and pulls down the voltage at the first node so that a LOW state is output onto a global bit line.

22 Claims, 11 Drawing Sheets

(56) References Cited

OTHER PUBLICATIONS

Sinangil, Mahmut E. et al., "A Reconfigurable 8T Ultra-Dynamic Voltage Scalable (U-DVS) SRAM in 65 nm CMOS", IEEE Journal of Solid-State Circuits, vol. 44, No. 11, Nov. 2009, pp. 3163-3173.

Verma, Naveen et al., "A 256 kb 65 nm 8T Subthreshold SRAM Employing Sense-Amplifier Redundancy", IEEE Journal of Solid-State Circuits, vol. 43, No. 1, Jan. 2008, pp. 141-149.

* cited by examiner

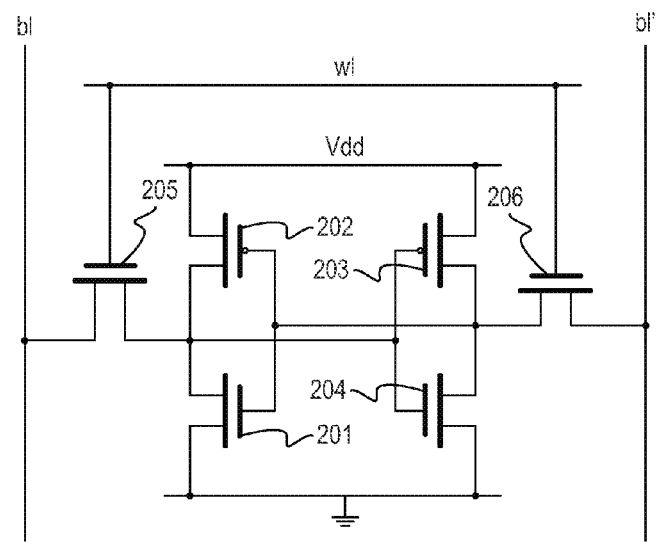
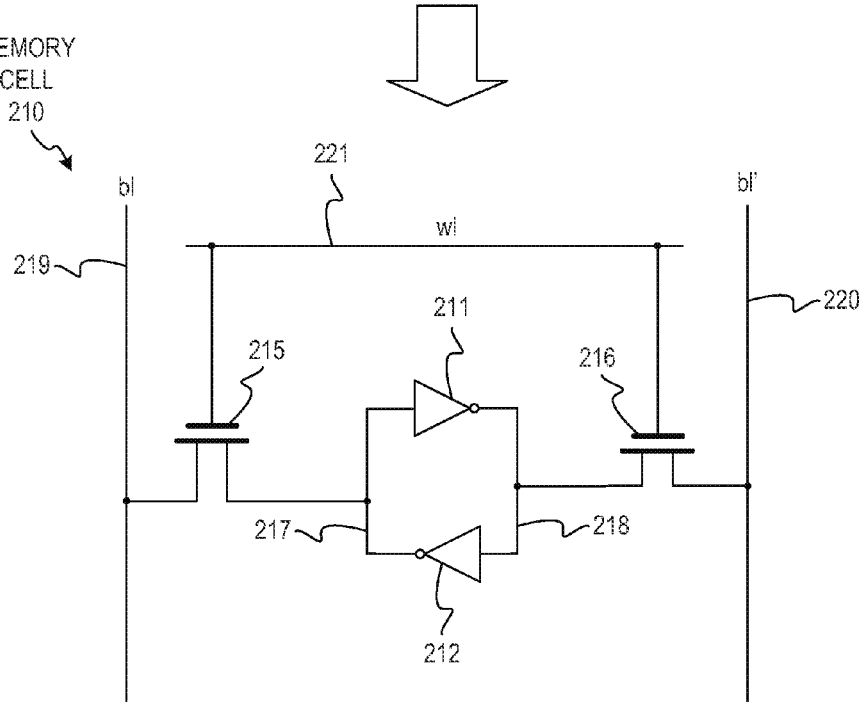
FIG. 2

SINGLE-ENDED SENSE AMPLIFIER WITH READ-ASSIST

BACKGROUND

The present application relates generally to an improved data processing apparatus and more specifically to a single-ended sense amplifier with read-assist.

Random access memory (RAM) most commonly refers to computer chips that temporarily store dynamic data to enhance computer performance. By storing frequently used or active files in random access memory, a computer may access the data faster than if the computer retrieves the data from a far-larger hard drive. Random access memory is volatile memory, meaning it loses its contents once power is cut. This is different from non-volatile memory such as hard disks and flash memory, which do not require a power source to retain data.

Random access memory, which may also be referred to as cache memory arrays, is comprised of a plurality of memory cells having an individual logic circuit associated with each memory cell. When logic functions are to be performed based on the content of more than one memory location in the random access memory, current implementation achieve such logic functions in custom logic blocks outside the memory arrays.

SUMMARY

In one illustrative embodiment, a sense amplifier is provided that comprises a precharge device coupled to an equalizer device, where the precharge device and the equalizer device turn off in an evaluation phase. The sense amplifier also comprises a first node coupled to the equalizer, a source follower device, a set device, and an input of an inverting amplifier. In response to receiving a set signal to turn on the set device and a precharged voltage level read bit line signal, a precharged voltage level of the first node remains above a switching point of the inverting amplifier such that a second node coupled to the output of the inverting amplifier is in a LOW state. The sense amplifier further comprises a keeper device coupled to an output of the inverting amplifier and a global bit line. The keeper device turns on in response to receiving a LOW signal from the inverting amplifier and pulls up the voltage at the first node so that a HIGH signal is output onto a global bit line.

In another embodiment, a sense amplifier is provided that comprises a precharge device coupled to an equalizer device, where the precharge device and the equalizer device turn off in an evaluation phase. The sense amplifier also comprises a first node coupled to the equalizer, a source follower device, a set device, and an input of an inverting amplifier. In response to receiving a set signal to turn on the set device and a read bit line signal that is discharging through a read stack path of the memory to ground and responsive to the read bit line signal discharging below a first predesigned voltage level, the first node drops below a second predesigned voltage level. A second node coupled to an output of the inverting amplifier within the sense amplifier starts a transition to a HIGH state due to a switching point of the inverting amplifier. The sense amplifier further comprises a read assist device coupled to the output of the inverting amplifier and the source follower device. The read assist device turns on in response to receiving a HIGH signal from the inverting amplifier and pulls down the voltage at the first node so that a LOW state is output onto a global bit line.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 2 depicts an example of a conventional 6 transistor (6T) memory cell in accordance with an illustrative embodiment;

DETAILED DESCRIPTION

Prior implementations of sense amplifiers have issues such as area inefficiency, sensitive to process variation, slow speed, low gain, lower array efficiency, requires external reference voltage, and/or voltage scalability. Thus, the illustrative embodiments provide a single-ended sense amplifier with read-assist that requires no external reference voltage, requires no internal reference voltage generation/dummy line voltage comparison, has area compactness (by choice of similar device type, compact topology, etc.), and has no passive devices. The single-ended sense amplifier with read-assist of the illustrative embodiments provides full-rail output without any extra inversion and has a robust and high noise margin. The single-ended sense amplifier with read-assist may be implemented in six transistor (6T) memory cells, eight transistor (8T) memory cells, as well as any other type of memory cell where a sense amplifier with the features of the illustrative embodiments is valued.

Figure 1:
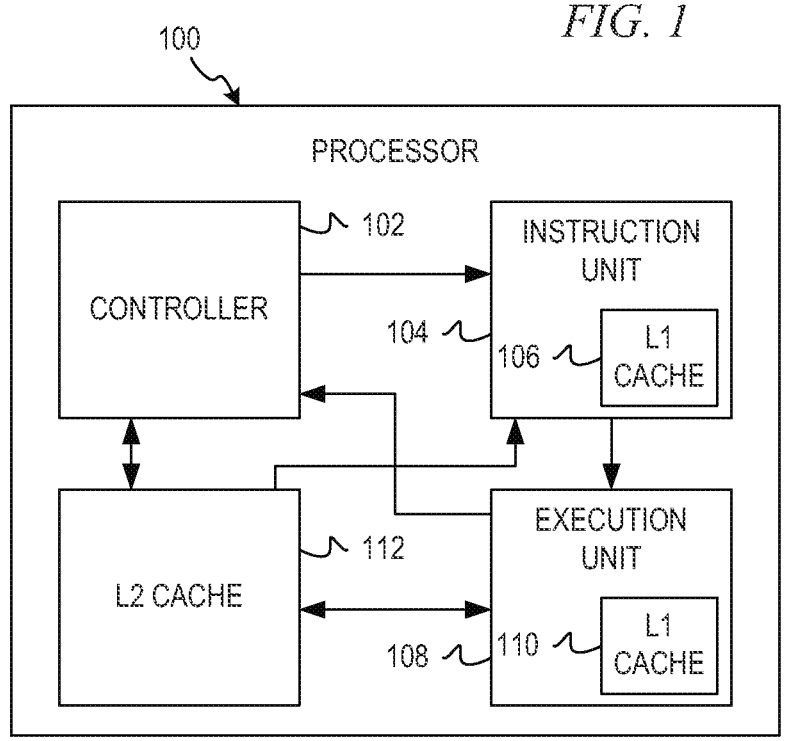
FIG. 1 is an exemplary block diagram of a processor in accordance with an illustrative embodiment.

FIG. 1 is provided as one example of a data processing environment in which a cache memory array may be utilized, i.e. in a cache of a processor. FIG. 1 is only offered as an example data processing environment in which the aspects of the illustrative embodiments may be implemented and is not intended to state or imply any limitation with regard to the types of, or configurations of, data processing environments in which the illustrative embodiments may be used. To the contrary, any environment in which a cache memory array may be utilized is intended to be within the spirit and scope of the present invention.

FIG. 1 is an exemplary block diagram of processor 100 in accordance with an illustrative embodiment. Processor 100 includes controller 102, which controls the flow of instructions and data into and out of processor 100. Controller 102 sends control signals to instruction unit 104, which includes L1 cache 106. Instruction unit 104 issues instructions to execution unit 108, which also includes L1 cache 110. Execution unit 108 executes the instructions and holds or forwards any resulting data results to, for example, L2 cache 112 or controller 102. In turn, execution unit 108 retrieves data from L2 cache 112 as appropriate. Instruction unit 104 also retrieves instructions from L2 cache 112 when necessary. Controller 102 sends control signals to control storage or retrieval of data from L2 cache 112. Processor 100 may contain additional components not shown, and is merely provided as a basic representation of a processor and does not limit the scope of the present invention. Although, FIG. 1 depicts only level 1 (L1) cache and Level 2 (L2) cache, the illustrative embodiments are not limited to only these levels of memory hierarchy. That is, the illustrative embodiments may be applied to any level of memory hierarchy without departing from the spirit and scope of the invention.

Those of ordinary skill in the art will appreciate that the hardware in FIG. 1 may vary depending on the implementation. Other internal hardware or peripheral devices, such as flash memory, equivalent non-volatile memory, or optical disk drives and the like, may be used in addition to or in place of the hardware depicted in FIG. 1. Also, the processes of the illustrative embodiments may be applied to a multiprocessor data processing system, without departing from the spirit and scope of the present invention.

Moreover, the data processing system 100 may take the form of any of a number of different data processing systems including client computing devices, server computing devices, a tablet computer, laptop computer, telephone or other communication device, a personal digital assistant (PDA), or the like. In some illustrative examples, data processing system 100 may be a portable computing device which is configured with flash memory to provide non-volatile memory for storing operating system files and/or user-generated data, for example. Essentially, data processing system 100 may be any known or later developed data processing system without architectural limitation.

FIG. 2 depicts an example of a conventional 6 transistor (6T) memory cell in accordance with an illustrative embodiment. Memory cell 200 forms the basis for most static random-access memories in complementary metal oxide semiconductor (CMOS) technology. Memory cell 200 uses six transistors 201-206 to store and access one bit. Transistors 201-204 in the center form two cross-coupled inverters, which is illustrate in the more simplified memory cell 210 comprising inverters 211 and 212. Due to the feedback structure created by inverters 211 and 212, a low input value on inverter 211 will generate a high value on inverter 212, which amplifies (and stores) the low value on inverter 212. Similarly, a high input value on inverter 211 will generate a low input value on inverter 212, which feeds back the low input value onto inverter 211. Therefore, inverters 211 and 212 will store their current logical value, whatever value that is.

Lines 217 and 218 between inverters 211 and 212 are coupled to separate bit-lines 219 and 220 via two n-channel pass-transistors 215 and 216. The gates of transistors 215 and 216 are driven by word line 221. In a memory array, word line 221 is used to address and enable all bits of one memory word. As long as word line 221 is kept low, memory cell 210 is decoupled from bit-lines 219 and 220. Inverters 211 and 212 keep feeding themselves and memory cell 210 stores its current value.

When word line 221 is high, both transistors 215 and 216 are conducting and connect the inputs and outputs of inverters 211 and 212 to bit-lines 219 and 220. That is, inverters 211 and 212 drive the current data value stored inside the memory cell 210 onto bit-line 219 and the inverted data value onto inverted bit-line 220. To write new data into memory cell 210, word line 221 is activated and, depending on the current value stored inside memory cell 210, there might be a short-circuit condition and the value inside memory cell 210 is literally overwritten. This only works because transistors 201-204 that make up inverters 211 and 212 are very weak. That is, transistors 201-204 are considered weak because when new data is to be written to transistors 201-204, the current state of transistors 201-204 may be easily overridden with the new state.

The majority of the power dissipated in cache memory arrays comes from the pre-charging and discharging of bit-lines during a read access. The bit-lines, such as bit-lines 219 and 220 in FIG. 2, span the entire height of the cache memory array and tend to be highly capacitive and thus introduce stability issues into each memory cell. Thus, to lower power consumption and improve stability of a 6T memory cell, such as memory cell 210, an improved memory cell is provided in an 8T memory cell.

Figure 3:
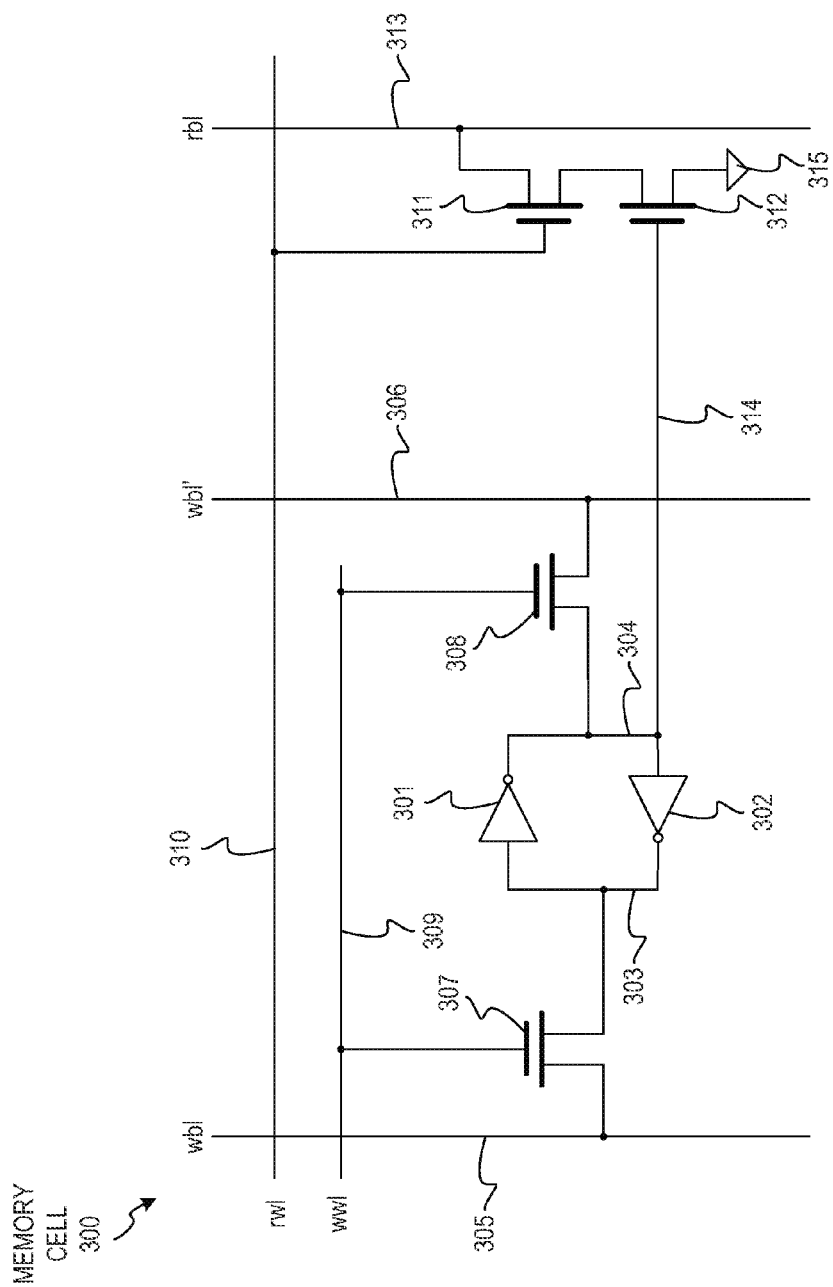
FIG. 3 depicts an example of a conventional 8 transistor (8T) memory cell in accordance with an illustrative embodiment.

FIG. 3 depicts an example of a conventional 8 transistor (8T) memory cell in accordance with an illustrative embodiment. Memory cell 300 uses eight transistors to store and access one bit. Four of the transistors form two cross-coupled inverters 301 and 302, as is illustrated in FIG. 2. Due to the feedback structure created by inverters 301 and 302, a low input value on inverter 301 will generate a high value on inverter 302, which amplifies (and stores) the low value on inverter 302. Similarly, a high input value on inverter 301 will generate a low input value on inverter 302, which feeds back the low input value onto inverter 301. Therefore, inverters 301 and 302 will store their current logical value, whatever value that is.

Lines 303 and 304 between inverters 301 and 302 are coupled to write bit-line 305 and inverted write bit-line 306 via two n-channel pass-transistors 307 and 308. The gates of transistors 307 and 308 are driven by write word line 309. In a memory array, write word line 309 is used to address and enable all bits of one memory word. As long as write word line 309 is kept low, memory cell 300 is decoupled from write bit-line 305 and inverted write bit-line 306. Inverters 301 and 302 keep feeding themselves and memory cell 300 stores its current value.

When write word line 309 is high, both transistors 307 and 308 are conducting and connect the inputs and outputs of inverters 301 and 302 to write bit-line 305 and inverted write bit-line 306. That is, inverters 301 and 302 drive the current data value stored inside the memory cell 300 onto bit-line 305 and the inverted data value onto inverted bit-line 306. To write new data into memory cell 300, write word line 309 is activated and, depending on the current value stored inside memory cell 300, there might be a short-circuit condition and the value inside memory cell 300 is literally overwritten. This only works because the transistors that make up inverters 301 and 302 are very weak. That is, the transistors are considered weak because when new data is to be written to the transistors, the current state of the transistors may be easily overridden with the new state.

During a read of memory cell 300, read word line 310 is high, which drives the gate of transistor 311 to pass the value from transistor 312 onto read bit-line 313. The value of transistor 312 is controlled by the value stored by inverters 301 and 302. That is, if the value stored by inverters 301 and 302 is a 1, then the gate of transistor 312 will be high through connection 314, which will cause a discharge to ground 315 and a 0 will be passed onto read bit-line 313. Conversely, if the value stored by inverters 301 and 302 is a 0, then the gate of transistor 312 will be low through connection 314, which will cause a 1 will be passed onto read bit-line 313.

As stated previously, in known systems, when the values two memory cells, such as either memory cell 200 of FIG. 2 or memory cell 300 of FIG. 3, are to have a logic function performed on the two memory cells, then the logic function is performed outside of the memory where the read bit lines of each of the memory cells is read and then compared through an logic gate such as an OR gate, an AND gate, a NOR gate, a NAND gate, or the like. However, in order to perform such logic functions with less exterior peripherals, reduced chip complexity, and overall improved power performance; the illustrative embodiments provide a mechanism for performing such logic functions directly within the memory.

Figure 4:
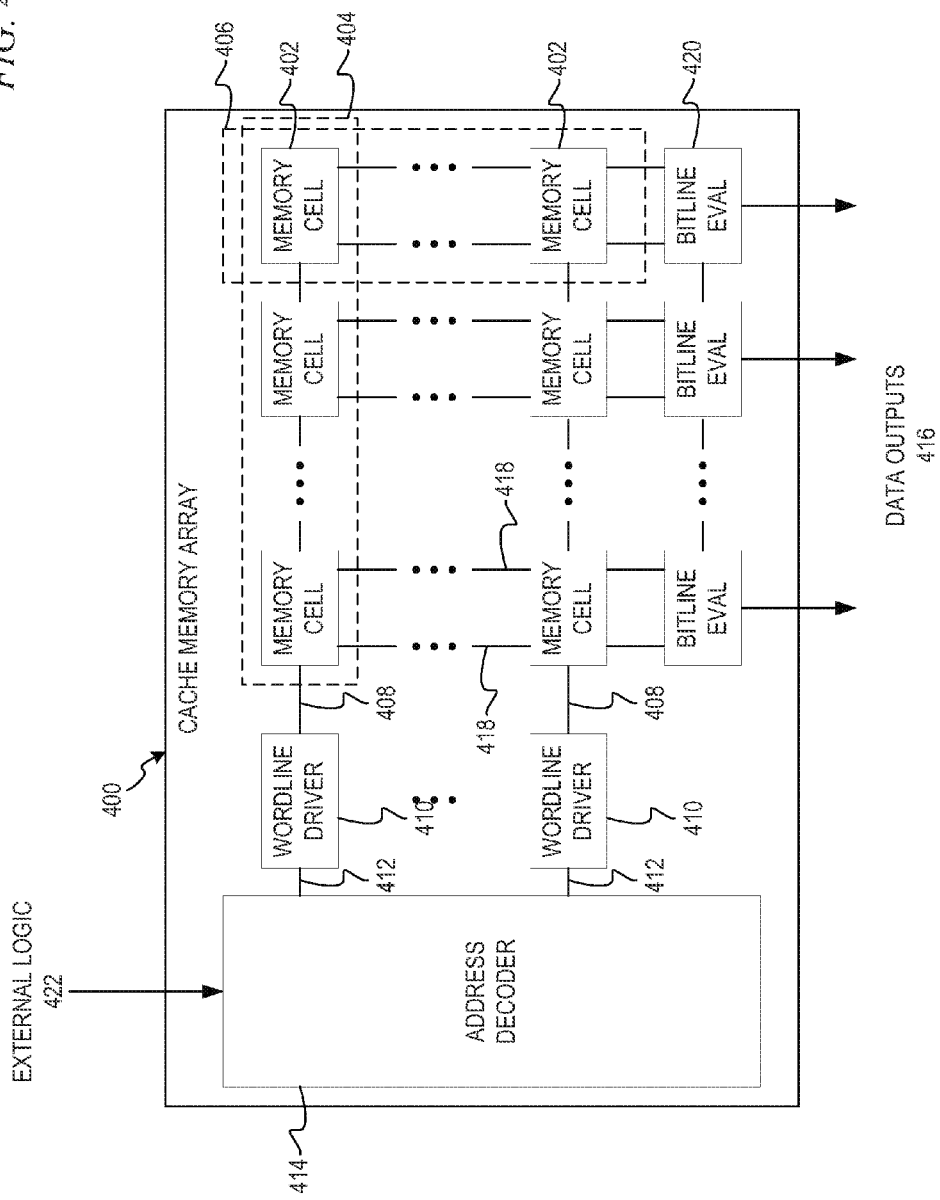
FIG. 4 illustrates a high-level example of a typical cache memory array comprising multiple memory cells in accordance with an illustrative embodiment.

FIG. 4 illustrates a high-level example of a typical cache memory array 400 comprising multiple memory cells 402 in accordance with an illustrative embodiment. Memory cells 402 are arranged as an array having rows 404 and columns 406. Memory cells 402 in a particular row 404 are connected to one another by word lines 408. Word lines 408 of each row 404 are also connected to word line drivers 410 which receive output 412 from address decoder 414 that identifies which row 404 is to be output and cache memory array 400 outputs the corresponding data entry through data outputs 416. Word line driver 410 may provide a single word line, such as word line 221 of FIG. 2, or a write word line and a read word line, such as write word line 309 and read word line 310 of FIG. 3. Memory cells 402 in a particular column 406 are connected to one another by a pair of bit lines 418 which are driven to complimentary during read/write executions and are traditionally precharged to the voltage supply. Bit lines 418 may be true and compliment bit lines, such as true bit line 219 and compliment 220 of FIG. 2, or a true write bit line, compliment write bit line, and a separate read bit line, such as true bit line 305, compliment bit line 306, and read bit line 313 of FIG. 3. Bit lines 418 feed sense amplifiers 420, which may also referred to as bit line evaluators, to convert the differential signal to a single-ended signal for use in logic downstream.

In operation, address decoder 414 receives an address associated with a read/write access from external logic 422. Address decoder 414 decodes the address and signals the particular one of word line drivers 410 associated with the decoded address using output 412. The particular one of word line drivers 410 then fires due to the signal from address decoder 414 and the data in the associated row 404 of memory cells 402 is output through data outputs 416 if the access is a read access or, if the access is a write access, data is written to memory cells 402 in associated row 404.

Figure 5:
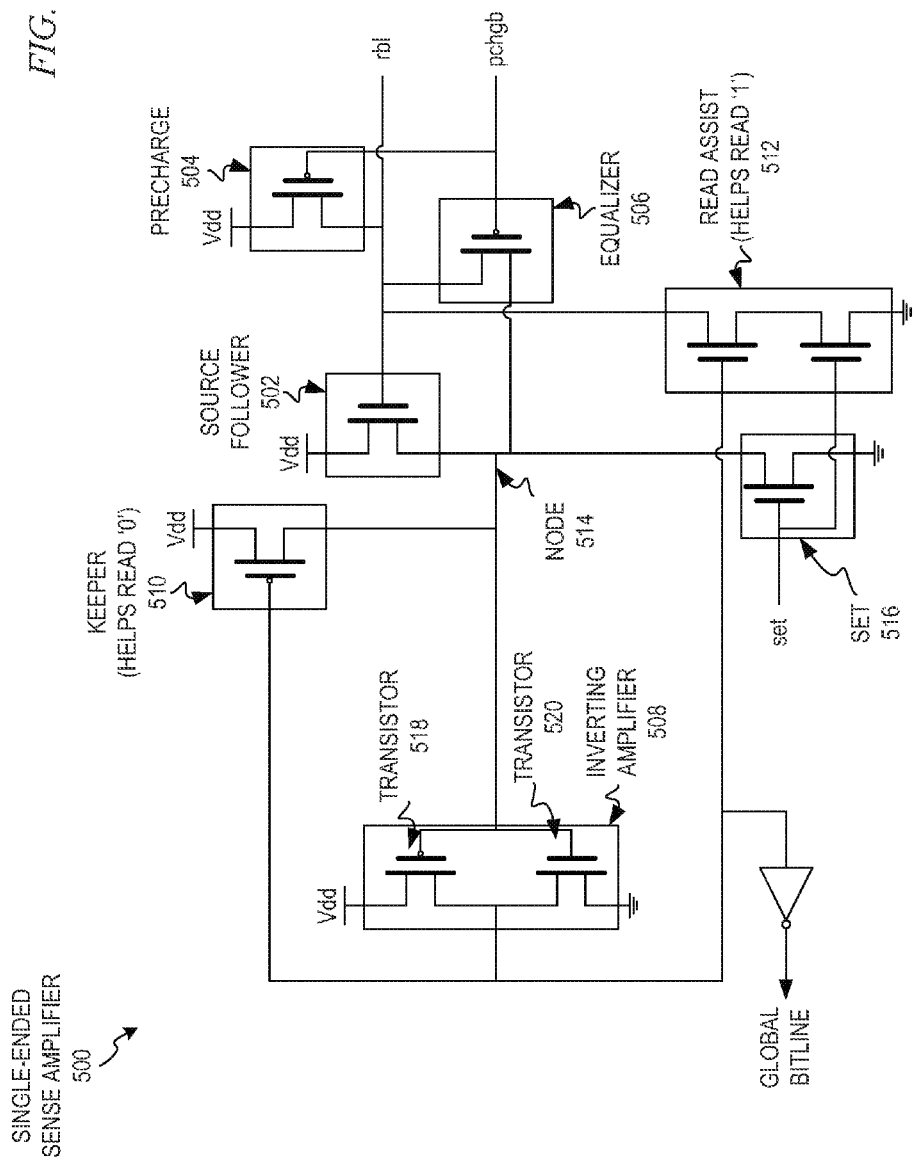
FIG. 5 depicts an exemplary block diagram of a single-ended sense amplifier with read assist in accordance with an illustrative embodiment.

FIG. 5 depicts an exemplary block diagram of a single-ended sense amplifier in accordance with an illustrative embodiment. Single-ended sense amplifier 500, which is a sense amplifier such as sense amplifier 420 of FIG. 4, comprises source follower device 502, precharge device 504, equalizer device 506, inverting amplifier 508, keeper device 510, and read assist device 512.

Precharge device 504 and equalizer device 506 provide for resetting the state of sense amplifier 500 in a precharge phase of every read operation. Source follower device 502 is a crucial component of the sense amplifier. That is, the voltage at node 514 of source follower device 502 is a function of the width/length (W/L) ratio of source follower device 502 and set device 516. The voltage at node 514 determines the output state of the inverting amplifier 508. The choice of source follower device 502 and set device 516 is based on a design point and specification and may be set to two different voltage levels for a read '0' and a read '1' operation. The sizing of transistors 518 and 520 within inverting amplifier 508 may be chosen to set a switching point as necessary.

Figure 6:
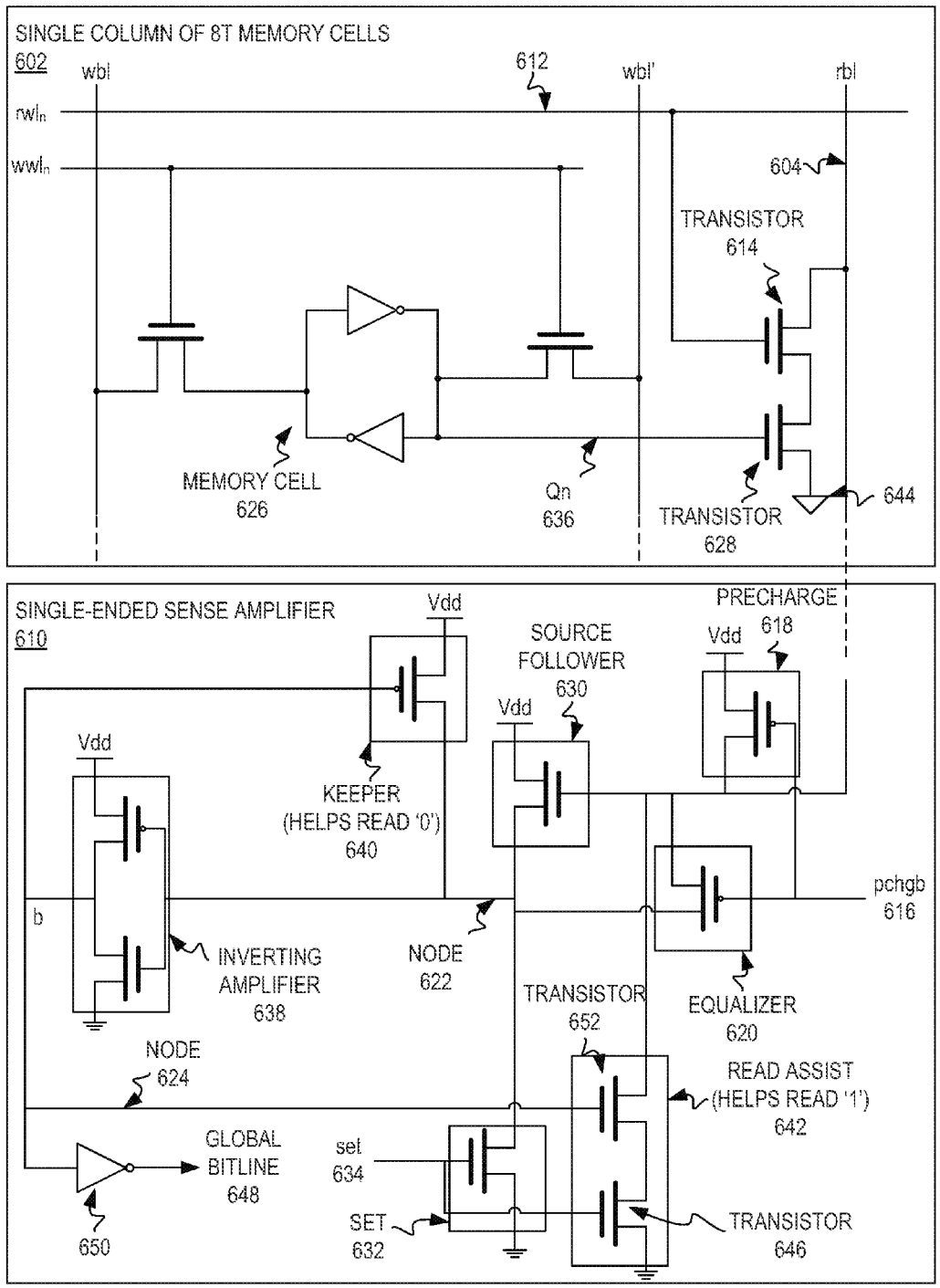
FIG. 6 depicts a single column of eight transistor (8T) memory cells coupled to a single-ended sense amplifier in accordance with an illustrative embodiment.

FIG. 6 depicts a single column of eight transistor (8T) memory cells coupled to a single-ended sense amplifier in accordance with an illustrative embodiment. All read path outputs from 8T memory cells 602 for one bit are coupled to read bit line 604, which is input to sense amplifier 610. However, the input to sense amplifier 610 may vary based on array design architecture such as in column multiplexing architecture. Column multiplexing is a very commonly used design technique to use one sense amplifier for multiple columns of memory cells. In that case, multiple read bit line signals may act as input to a column multiplexer and the output of the column multiplexer acts as input to sense amplifier 610 which is often referred to as read data line (rdlc) due to the multiplexing. Thus, with regard to a 6T memory cell, either a read bit line or a complementary read bit line may be used without departing from the spirit and scope of the invention.

Sense amplifier 610 has two phases: a precharge phase and an evaluation phase. During a read operation, an $n^{th}$ row from 8T memory cells 602, in the precharge phase, read word line signal ($rwl_n$) 612 is LOW and transistor 614 is turned off so that nothing is read onto the read path of read bit line (rbl) 604. Precharge signal (not shown) goes HIGH and precharge bar signal (pchgb) 616 goes LOW. With pchgb 616 LOW, precharge device 618 and equalizer device 620 are turned on and pull up the read bit line (rbl) 604 and node 622 to supply voltage (Vdd). At the end of the precharge cycle, the voltage level at node 622 is Vdd and the voltage level at node 624 is ground (Gnd).

In the evaluation phase, $rwl_n$ 612 goes HIGH and turns on transistor 614 so that the value in memory cell 626 may be read onto the read path of read bit line 604 via transistor 628. Also in the evaluation phase, pchgb 616 goes HIGH, thus precharge device 618 and equalizer device 620 are turned off and the voltage of source follower device 630 depends on the sizing of source follower device 630 and set device 632 and the input voltage to sense amplifier 610 which is identical to the rbl signal 604. The evaluation starts after SET signal 634 goes HIGH, which also turns on transistor 646 in read assist device 642. The timing relationship between SET signal 634 and $rwl_n$ signal 612 is very important and may be controlled from local clock buffers as necessary. The time delay between SET signal 634 and $rwl_n$ signal 612 helps rbl 604 to build up to a distinguishable voltage level from the precharge voltage before sense amplifier 610 turns on.

In the event that memory cell 602 is storing a '0', memory cell output signal (Qn) 636 is Gnd and transistor 628 is turned off. Thus, there is no discharge path from rbl 604 to ground and rbl 604 remains HIGH. Hence, node 622 remains above the switching point of inverting amplifier 638 and node 624 remains LOW. Since node 624 is LOW, keeper device 640 remains turned on and helps to pull up node 622 by creating a positive feedback path whereas read assist device 642 remains turned off. With node 624 being LOW, a '1' is output on to global bit line 648 due to inverter 650 inverting the LOW signal to a HIGH signal, which is recognized by any logic downstream as being a '0' from memory cell 602. While FIG. 6 depicts inverter 650 coupled at node 624, one of ordinary skill in the art would recognize that inverter 650 may be replaced by another logic device, such as a NAND, NOR, or the like, based on required functionalities and/or multiplexing at global bit line 648.

In the event that memory cell 602 is storing a '1', memory cell output signal (Qn) 636 is Vdd and transistor 628 turns on. Hence, rbl 604 starts discharging through the read stack path of 8T memory cells 602 to ground 644. When rbl 604 discharges below a first predesigned voltage level, for example 750 mV, the voltage at node 622 crosses below a second predesigned voltage level, for example 300 mV, and node 624 starts a transition to HIGH due to the switching point of inverting amplifier 638. As a result, keeper device 640 turns off and transistor 652 in read assist device 642 turns on. As transistor 652 in read assist 642 turns on, read assist device 642 pulls down rbl 604 faster by creating a positive feedback path and brings down node 622 even lower. With node 624 being HIGH, a '0' is output on to global bit line 648 due to inverter 650 inverting the HIGH signal to a LOW signal which is recognized by any logic downstream as being a '1' from memory cell 602.

Figure 7:
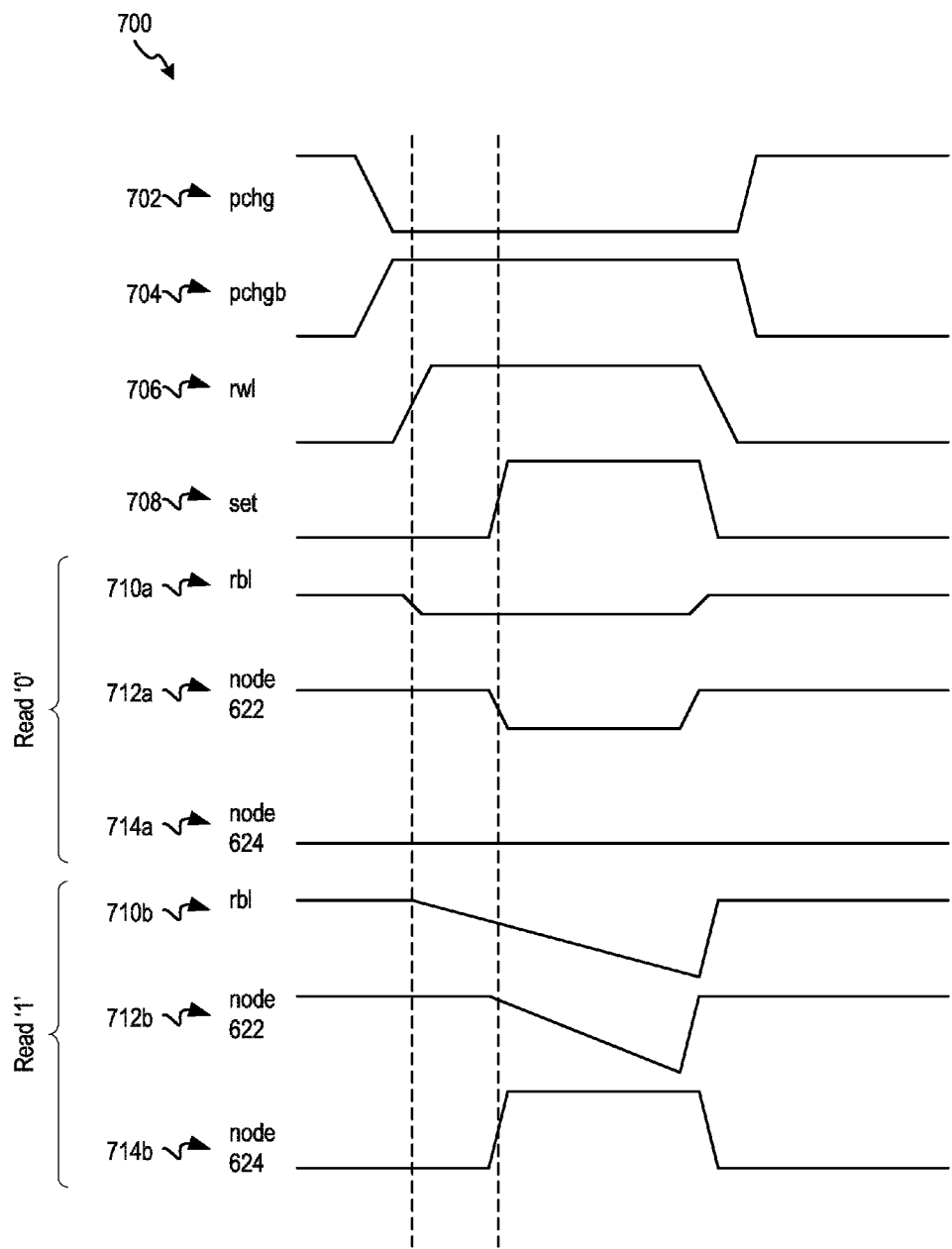
FIG. 7 depicts a timing diagram of both a read '0' operation and a read '1' operation in accordance with an illustrative embodiment.

FIG. 7 depicts a timing diagram of both a read '0' operation and a read '1' operation in accordance with an illustrative embodiment. In timing diagram 700, during a evaluation phase, precharge (pchg) signal 702 goes LOW, thus precharge bar (pchgb) signal 704 goes HIGH and the precharge device and equalizer device of the sense amplifier are turned off. When a value is to be read out of the memory cell, read word line (rwl) signal 706 goes HIGH and turns on a first transistor associated with the read bit line (rbl) so that the value in the memory cell may be read onto the read path of the read bit line. The evaluation starts after SET signal 708 goes HIGH, which also turns on a first transistor associated with the read assist device in the sense amplifier. As stated previously, the timing relationship between SET signal 708 and rwl signal 706 is very important and may be controlled from local clock buffers as necessary. The time delay between SET signal 708 and rwl signal 706 helps rbl 710a and 710b to build up to a distinguishable voltage level from the precharge voltage before the sense amplifier turns on.

In the event that the memory cell is storing a '0', a memory cell output signal (Qn) is Gnd and a second transistor associated with read bit line (rbl) 710a is turned off. Thus, there is no discharge path from rbl 710a to ground and the rbl 710a remains HIGH. Hence, node 712a, which relates to node 622 of FIG. 6, remains above the switching point of the inverting amplifier and node 714a, which relates to node 624 of FIG. 6, remains LOW. Since node 714a is LOW, a keeper device in the sense amplifier remains turned on and helps to pull up node 712a whereas the read assist device in the sense amplifier remains turned off.

In the event that the memory cell is storing a '1', the memory cell output signal (Qn) is Vdd and the second transistor associated with the read bit line (rbl) 710b is turned on. Hence, rbl 710b starts discharging through the read stack path of the memory cell to ground. When rbl 710b discharges below a first predesigned voltage level, for example 750 mV, the voltage at node 712b, which relates to node 622 of FIG. 6, crosses below a second predesigned voltage level, for example 300 mV, and node 714b, which relates to node 624 of FIG. 6, starts a transition to HIGH due to the switching point of the inverting amplifier. As a result, the keeper device turns off and a second transistor in the read assist turns on. As the second transistor in the read assist turns on, the read assist pulls down rbl 710b faster and brings down node 712b even lower. One note is that the timing relationship between the signals and voltage levels FIG. 7 are approximate.

Figure 8:
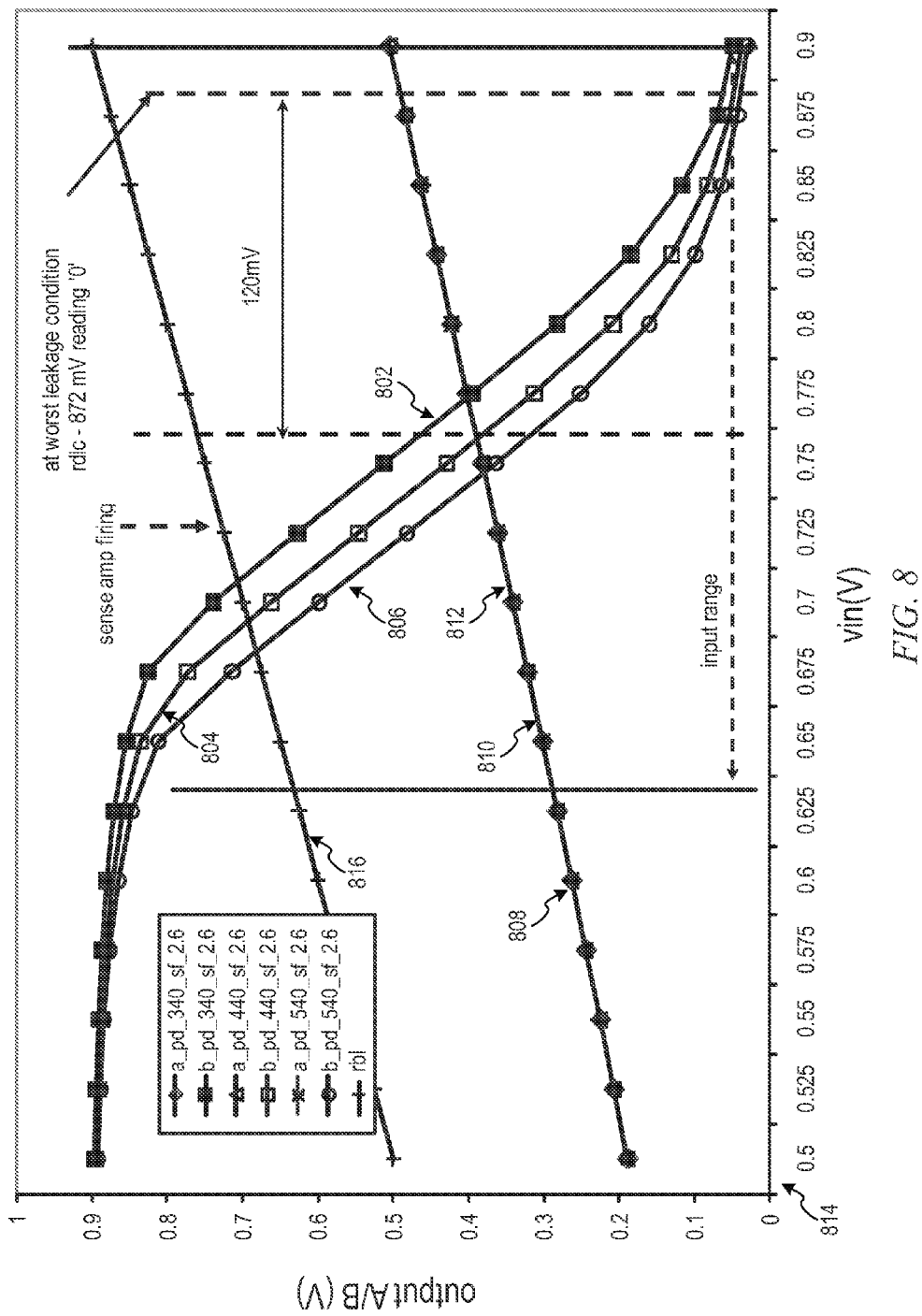
FIG. 8 depicts the characteristics of the single-ended sense amplifier of the illustrative embodiments.

FIG. 8 depicts the characteristics of the single-ended sense amplifier of the illustrative embodiments. The various 'a' curves 802, 804, and 806 and 'b' curves 808, 810, and 812 correspond to the voltage sensitivity of nodes 622 and 624 of FIG. 6 with regard to the sizing, i.e. different widths, of the source follower device and the transistor coupled to ground, which relates to transistor 520 of FIG. 5. Widths and lengths of transistors are defined by a Gate channel width and length. The drain-source current $I_{DS}$ of a transistor MOS is calculated using the following formula: $I_{Ds}=k*W/L*(V_{GS}-V_T)^2$, where $V_{GS}$ is gate-source voltage, $V_T$ is threshold voltage, and k is $\mu*C_{ox}$, which is process transconductance, where $C_{ox}$ is the capacitance of the oxide layer and $\mu$ is the charge mobility. X-axis 814 represents input voltage to the sense amplifier which is identical to the rbl signal. As shown in FIG. 8, the voltage at node 624 ('b' curves 808, 810, and 812) is an approximately level shifted version of the voltage level at rbl, represented by curve 816. The inverting amplifier of the sense amplifier (element 508 of FIG. 5 or element 638 of FIG. 6) flips its state when node a ('a' curves 802, 804, and 806) and rbl cross.

Figure 9:
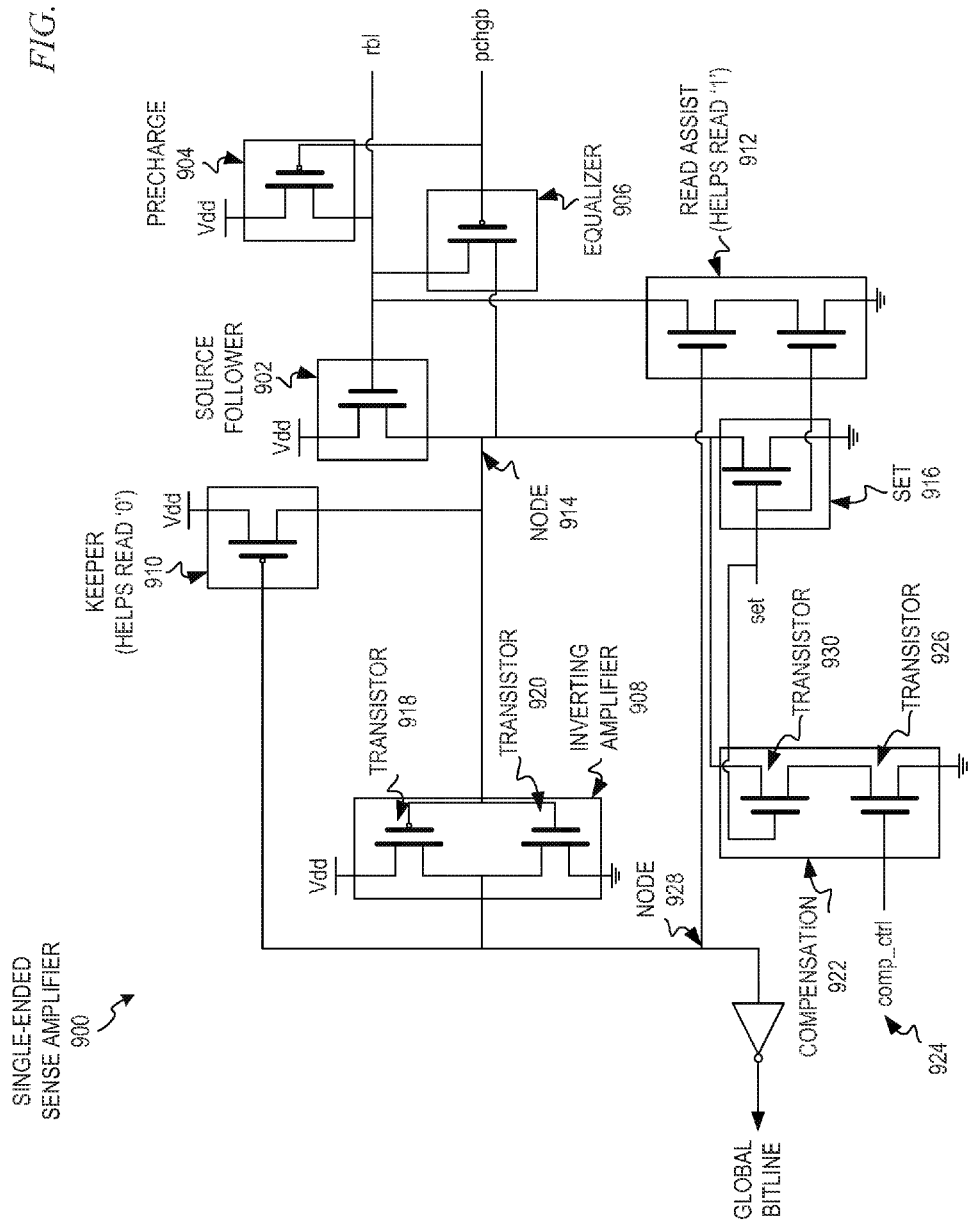
FIG. 9 depicts an exemplary block diagram of a single-ended sense amplifier with compensation in accordance with an illustrative embodiment.

FIG. 9 depicts an exemplary block diagram of a single-ended sense amplifier with compensation in accordance with an illustrative embodiment. Single-ended sense amplifier 900, which is a sense amplifier such as sense amplifier 420 of FIG. 4, comprises source follower device 902, precharge device 904, equalizer device 906, inverting amplifier 908, keeper device 910, read assist device 912, and compensation device 922.

Precharge device 904 and equalizer device 906 provide for resetting the state of sense amplifier 900 in a precharge phase of every read operation. Source follower device 902 is a crucial component of the sense amplifier. That is, the voltage at node 914 of source follower device 902 is a function of the W/L ratio of source follower device 902 and set device 916. The voltage at node 914 determines the output state of the inverting amplifier 908. The choice of source follower device 902 and set device 916 is based on a design point and specification and may be set to two different voltage levels for a read '0' and a read '1' operation. The sizing of transistors 918 and 920 within inverting amplifier 908 may be chosen to set a switching point as necessary for output to node 928.

As mentioned earlier, voltage at node 914 depends on the ratio of W/L of source follower device 902 and set device 916. Hence, the variation in the W/L of source follower device 902 device due to process variation affect the voltage level shifting of source follower device 902 and hence the correctness of the read operation.

Single-ended sense amplifier 900 thus comprises compensation control mechanism via comp_ctrl signal 924 and compensation device 922 to compensate the process variation effect on source follower device 902. The stack formed by transistor 926 and transistor 930 adds a parallel path to set device 916 and acts as a compensation control. When comp_ctrl signal 924 is HIGH, the compensation control path turn on. If the width of source follower device 902 increases above the nominal design point or the width of set device 916 shrinks below a nominal design point, comp_ctrl signal 924 is turned on and voltage level at node 914 comes back to a nominal level. However, the illustrative compensation control mechanism does not work if the width of source follower device 902 shrinks and the width of set device 916 increases. Another similar parallel stack with PD or SF device is needed in that situation.

Figure 10:
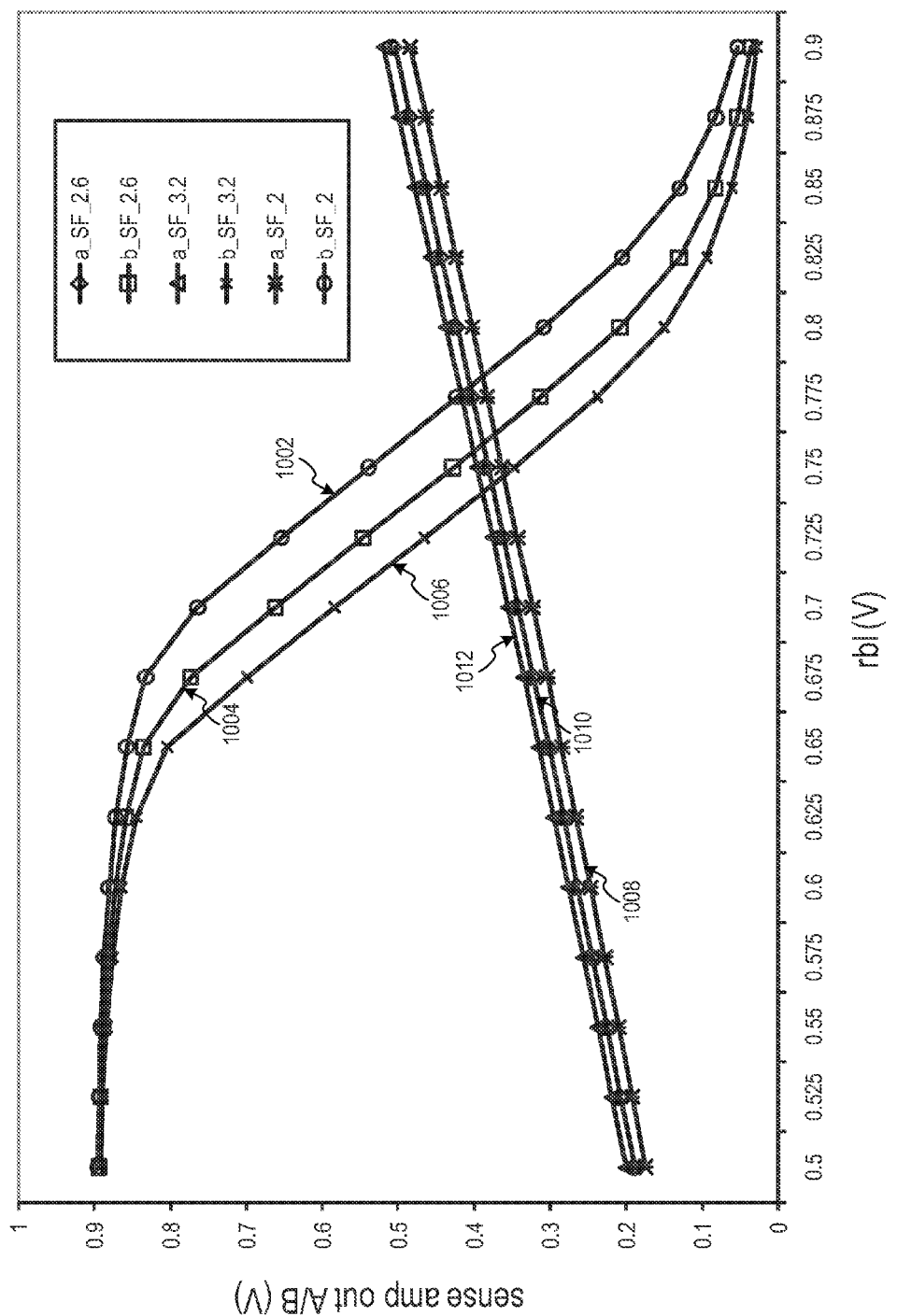
FIG. 10 depicts the characteristics of the single-ended sense amplifier with compensation of the illustrative embodiments.

FIG. 10 depicts the characteristics of the single-ended sense amplifier with compensation of the illustrative embodiments. The various 'a' curves 1002, 1004, and 1006 and 'b' curves 1008, 1010, and 1012 correspond to the voltage sensitivity of nodes 914 and 928 of FIG. 9, respectively, with regard to the sizing, i.e. different widths of a source follower device, such as source follower device 902 of FIG. 9. FIG. 10 shows voltage curve at node 914 that shifts up if the width of the source follower device increases.

Thus, the illustrative embodiments provide mechanisms for a single-ended sense amplifier that requires no external reference voltage, requires no internal reference voltage generation/dummy line voltage comparison, has area compactness (by choice of similar device type, compact topology, etc.), and has no passive devices. The single-ended sense amplifier with read-assist of the illustrative embodiments provides full-rail output without any extra inversion and has a robust and high noise margin. The single-ended sense amplifier with read-assist may be implemented in six transistor (6T) memory cells, eight transistor (8T) memory cells, as well as any other type of memory cell where a sense amplifier with the features of the illustrative embodiments is valued.

The circuit as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design may then be converted into the appropriate format (e.g., GDSII) for the fabrication of photolithographic masks, which typically include multiple copies of the chip design in question that are to be formed on a wafer. The photolithographic masks may be utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher level carrier) or in a multichip package (such as a ceramic carrier that has either or both surface interconnections or buried interconnections). in any case, the chip may then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Moreover, the end products in which the integrated circuit chips may be provided may include game machines, game consoles, hand-held computing devices, personal digital assistants, communication devices, such as wireless telephones and the like, laptop computing devices, desktop computing devices, server computing devices, or any other computing device.

Figure 11:
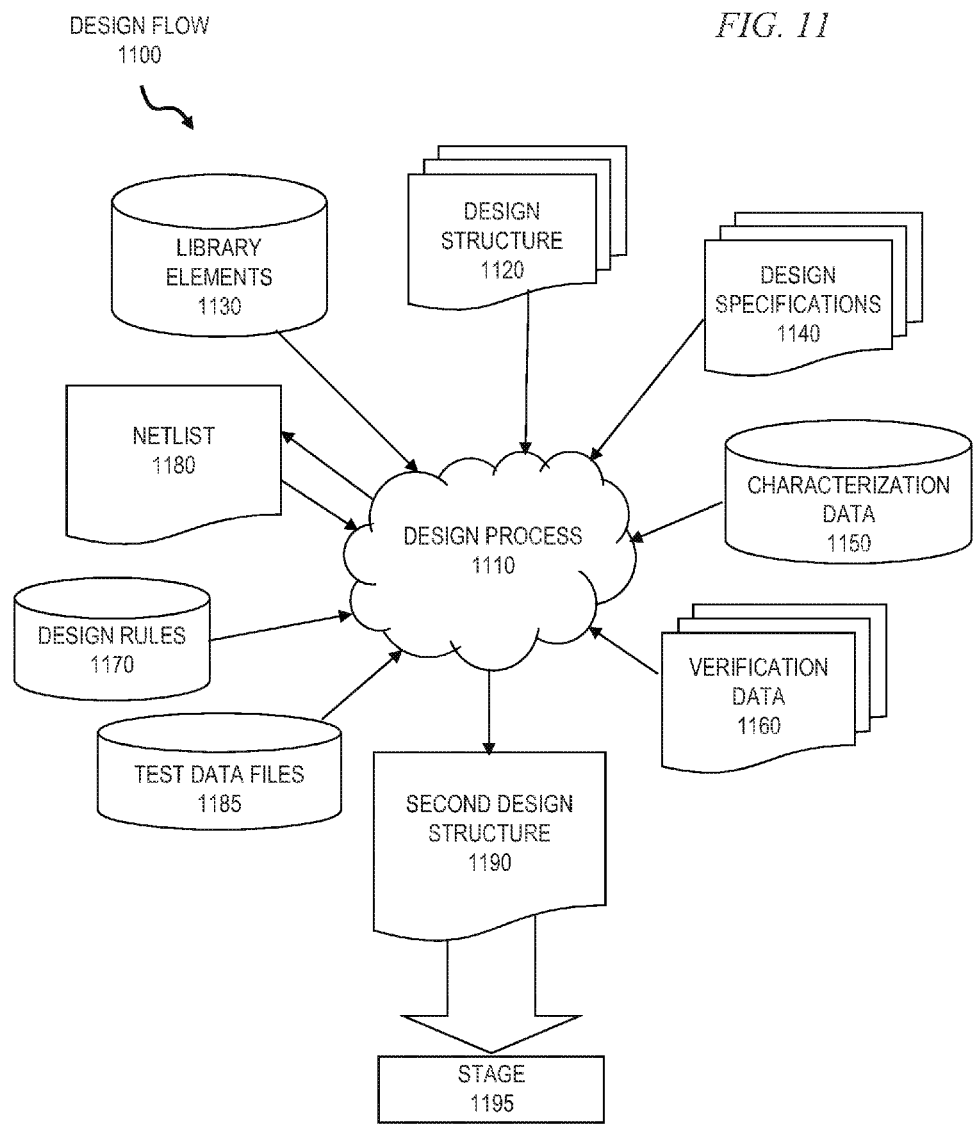
FIG. 11 is a flow diagram of a design process used in semiconductor design, manufacture, and/or test.

FIG. 11 shows a block diagram of an exemplary design flow 1100 used, for example, in semiconductor IC logic design, simulation, test, layout, and manufacture. Design flow 1100 includes processes and mechanisms for processing design structures to generate logically or otherwise functionally equivalent representations of the embodiments of the invention shown in FIGS. 2-10. The design structures processed and/or generated by design flow 1100 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 11 illustrates multiple such design structures including an input design structure 1120 that is preferably processed by a design process 1110. Design structure 1120 may be a logical simulation design structure generated and processed by design process 1110 to produce a logically equivalent functional representation of a hardware device. Design structure 1120 may also or alternatively comprise data and/or program instructions that when processed by design process 1110, generate a functional representation of the physical structure of a hardware device. Whether representing functional and/or structural design features, design structure 1120 may be generated using electronic computer-aided design (ECAD) such as implemented by a core developer/designer. When encoded on a machine-readable data transmission or storage medium, design structure 1120 may be accessed and processed by one or more hardware and/or software modules within design process 1110 to simulate or otherwise functionally represent an electronic component, circuit, electronic or logic module, apparatus, device, or system such as those shown in FIGS. 2-10. As such, design structure 1120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1110 preferably employs and incorporates hardware and/or software modules for synthesizing, translating, or otherwise processing a design/simulation functional equivalent of the components, circuits, devices, or logic structures shown in FIGS. 2-10 to generate a netlist 1180 which may contain design structures such as design structure 1120. Netlist 1180 may comprise, for example, compiled or otherwise processed data structures representing a list of wires, discrete components, logic gates, control circuits, I/O devices, models, etc. that describes the connections to other elements and circuits in an integrated circuit design. Netlist 1180 may be synthesized using an iterative process in which netlist 1180 is resynthesized one or more times depending on design specifications and parameters for the device. As with other design structure types described herein, netlist 1180 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1110 may include hardware and software modules for processing a variety of input data structure types including netlist 1180. Such data structure types may reside, for example, within library elements 1130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1140, characterization data 1150, verification data 1160, design rules 1170, and test data files 1185 which may include input test patterns, output test results, and other testing information. Design process 1110 may further include modules for performing standard circuit design processes such as timing analysis, verification, design rule checking, place and route operations, etc.

Design process 1110 employs and incorporates well-known logic and physical design tools such as HDL compilers and simulation model build tools to process design structure 1120 together with some or all of the depicted supporting data structures to generate a second design structure 1190. Similar to design structure 1120, design structure 1190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-10. In one embodiment, design structure 1190 may comprise a compiled, executable HDL simulation model that functionally simulates the devices shown in FIGS. 2-10.

Design structure 1190 may also employ a data format used for the exchange of layout data of integrated circuits and/or symbolic data format (e.g. information stored in a GDSII (GDS2), GL1, OASIS, map files, or any other suitable format for storing such design data structures). Design structure 1190 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIGS. 2-10. Design structure 1190 may then proceed to a stage 1195 where, for example, design structure 1190 proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A sense amplifier, comprising:
   a precharge device coupled to an equalizer device, wherein the precharge device and the equalizer device turn off in an evaluation phase;
   a first node coupled to the equalizer, a source follower device, a set device, and an input of an inverting amplifier, wherein, responsive to receiving a set signal to turn on the set device and a precharged voltage level read bit line signal, a precharged voltage level of the first node remains above a switching point of the inverting amplifier such that a second node coupled to the output of the inverting amplifier is in a LOW state; and
   a keeper device coupled to an output of the inverting amplifier and a global bit line, wherein the keeper device turns on in response to receiving a LOW signal from the inverting amplifier and pulls up the voltage at the first node so that a HIGH signal is output onto a global bit line.

2. The sense amplifier of claim 1, wherein the keeper device pulls up the voltage at the first node at a faster rate by creating a positive feedback path.

3. The sense amplifier of claim 1, wherein a HIGH read bit line signal indicates that a memory cell within a memory that is being read is storing a zero.

4. The sense amplifier of claim 1, further comprising:
   the voltage at the first node, responsive to receiving the set signal to turn on the set device and a read bit line signal that is discharging through a read stack path of the memory to ground and responsive to the read bit line signal discharging below a first predesigned voltage level, drops below a second predesigned voltage level;
   the second node starts a transition to a HIGH state due to the switching point of the inverting amplifier;
   the keeper device turns off in response to receiving a HIGH signal from the inverting amplifier; and
   a read assist device coupled to the output of the inverting amplifier and the source follower device, wherein the read assist device turns on in response to receiving a HIGH signal from the inverting amplifier and pulls down the voltage at the first node so that a LOW state is output onto the global bit line.

5. The sense amplifier of claim 4, wherein the read assist device pulls down the voltage at the first node at a faster rate by creating a positive feedback path.

6. The sense amplifier of claim 4, wherein the LOW read bit line signal indicates that a memory cell within a memory that is being read is storing a one.

7. The sense amplifier of claim 1, wherein the precharge device and the equalizer device are turned on in a precharge phase and pull up the read bit line and the first node to the precharged voltage level.

8. A sense amplifier, comprising:
   a precharge device coupled to an equalizer device, wherein the precharge device and the equalizer device turn off in an evaluation phase;
   a first node coupled to the equalizer, a source follower device, a set device, and an input of an inverting amplifier, responsive to receiving a set signal to turn on the set device and a read bit line signal that is discharging through a read stack path of the memory to ground and responsive to the read bit line signal discharging below a first predesigned voltage level, drops below a second predesigned voltage level;
   a second node coupled to an output of the inverting amplifier, wherein the second node starts a transition to a HIGH state due to a switching point of the inverting amplifier; and
   a read assist device coupled to the output of the inverting amplifier and the source follower device, wherein the read assist device turns on in response to receiving a HIGH signal from the inverting amplifier and pulls down the voltage at the first node so that a LOW state is output onto a global bit line.

9. The sense amplifier of claim 8, wherein the read assist device pulls down the voltage at the first node at a faster rate by creating a positive feedback path.

10. The sense amplifier of claim 8, wherein the LOW read bit line signal indicates that a memory cell within a memory that is being read is storing a one.

11. The sense amplifier of claim 8, further comprising:
the voltage at the first node, responsive to receiving the set signal to turn on the set device and a precharged voltage level read bit line signal, remains above a switching point of the inverting amplifier such that the second node remains in a LOW state;
the read assist device turns off in response to receiving a LOW signal from the inverting amplifier; and
a keeper device coupled to the output of the inverting amplifier and a global bit line, wherein the keeper device turns on in response to receiving a LOW signal from the inverting amplifier and pulls up the voltage at the first node so that a HIGH signal is output onto the global bit line.

12. The sense amplifier of claim 11, wherein the keeper device pulls up the voltage at the first node at a faster rate by creating a positive feedback path.

13. The sense amplifier of claim 11, wherein the HIGH read bit line signal indicates that a memory cell within a memory that is being read is storing a zero.

14. The sense amplifier of claim 8, wherein the precharge device and the equalizer device are turned on in a precharge phase and pull up the read bit line and the first node to the precharged voltage level.

15. A memory comprising:
a set of memory cells; and
a sense amplifier coupled to the set of memory cells, wherein the sense amplifier comprises:
 a precharge device coupled to an equalizer device, wherein the precharge device and the equalizer device turn off in an evaluation phase;
 a first node coupled to the equalizer, a source follower device, a set device, and an input of an inverting amplifier, wherein, responsive to receiving a set signal to turn on the set device and a precharged voltage level read bit line signal from one or more of the set of memory cells, a precharged voltage level of the first node remains above a switching point of the inverting amplifier such that a second node coupled to the output of the inverting amplifier is in a LOW state; and
 a keeper device coupled to an output of the inverting amplifier and a global bit line, wherein the keeper device turns on in response to receiving a LOW signal from the inverting amplifier and pulls up the voltage at the first node so that a HIGH signal is output onto a global bit line.

16. The memory of claim 15, wherein a HIGH read bit line signal indicates that a memory cell within the memory that is being read is storing a zero.

17. The memory of claim 15, wherein the sense amplifier further comprises:
the voltage at the first node, responsive to receiving the set signal to turn on the set device and a read bit line signal that is discharging through a read stack path of one or more of the set of memory cells to ground and responsive to the read bit line signal discharging below a first predesigned voltage level, drops below a second predesigned voltage level;
the second node starts a transition to a HIGH state due to the switching point of the inverting amplifier;
the keeper device turns off in response to receiving a HIGH signal from the inverting amplifier; and
a read assist device coupled to the output of the inverting amplifier and the source follower device, wherein the read assist device turns on in response to receiving a HIGH signal from the inverting amplifier and pulls down the voltage at the first node so that a Low state is output onto the global bit line.

18. The memory of claim 17, wherein the LOW read bit line signal indicates that a memory cell within the memory that is being read is storing a one.

19. A memory comprising:
a set of memory cells; and
a sense amplifier coupled to the set of memory cells, wherein the sense amplifier comprises:
 a precharge device coupled to an equalizer device, wherein the precharge device and the equalizer device turn off in an evaluation phase;
 a first node coupled to the equalizer, a source follower device, a set device, and an input of an inverting amplifier, responsive to receiving a set signal to turn on the set device and a read bit line signal that is discharging through a read stack path of one or more of the set of memory cells to ground and responsive to the read bit line signal discharging below a first predesigned voltage level, drops below a second predesigned voltage level;
 a second node coupled to an output of the inverting amplifier, wherein the second node starts a transition to a HIGH state due to a switching point of the inverting amplifier; and
 a read assist device coupled to the output of the inverting amplifier and the source follower device, wherein the read assist device turns on in response to receiving HIGH signal from the inverting amplifier and pulls down the voltage at the first node so that a LOW state is output onto a global bit line.

20. The memory of claim 19, wherein the LOW read bit line signal indicates that a memory cell within the memory that is being read is storing a one.

21. The memory of claim 19, wherein the sense amplifier further comprises:
the voltage at the first node, responsive to receiving the set signal to turn on the set device and a precharged voltage level read bit line signal from one or more of the set of memory cells, remains above a switching point of the inverting amplifier such that the second node remains in a LOW state;
the read assist device turns off in response to receiving a LOW signal from the inverting amplifier; and
a keeper device coupled to the output of the inverting amplifier and a global bit line, wherein the keeper device turns on in response to receiving a LOW signal from the inverting amplifier and pulls up the voltage at the first node so that a HIGH signal is output onto the global bit line.

22. The memory of claim 21, wherein the HIGH read bit line signal indicates that a memory cell within the memory that is being read is storing a zero.

* * * * *